United States Patent
Bradbury et al.

(10) Patent No.: US 10,585,626 B2
(45) Date of Patent: Mar. 10, 2020

(54) MANAGEMENT OF NON-UNIVERSAL AND UNIVERSAL ENCODERS

(71) Applicant: International Business Machines Corporation, Armonk, NY (US)

(72) Inventors: Jonathan Bradbury, Poughkeepsie, NY (US); Matthias Klein, Wappingers Falls, NY (US); Ashutosh Misra, Karnataka (IN); Anthony Sofia, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/834,133

(22) Filed: Dec. 7, 2017

(65) Prior Publication Data
US 2019/0179572 A1   Jun. 13, 2019

(51) Int. Cl.
*G06F 3/06* (2006.01)
*H03M 7/30* (2006.01)

(52) U.S. Cl.
CPC ............ *G06F 3/0661* (2013.01); *G06F 3/064* (2013.01); *G06F 3/0608* (2013.01); *G06F 3/0673* (2013.01); *H03M 7/30* (2013.01)

(58) Field of Classification Search
CPC ...... G06F 3/0661; G06F 3/068; G06F 3/0673; G06F 3/064
USPC .................................................... 341/50–55
See application file for complete search history.

(56) References Cited

U.S. PATENT DOCUMENTS

| | | | |
|---|---|---|---|
| 6,560,596 B1* | 5/2003 | Margulies | G06F 16/9566 707/690 |
| 7,221,801 B2 | 5/2007 | Jang et al. | |
| 7,688,233 B2 | 3/2010 | Schneider | |
| 8,244,895 B2 | 8/2012 | Mukherjee et al. | |
| 8,508,389 B2 | 8/2013 | McCanne et al. | |
| 9,035,807 B2 | 5/2015 | Jiang et al. | |
| 9,290,816 B2 | 3/2016 | Pregibon et al. | |
| 2008/0219579 A1* | 9/2008 | Aksyuk | G02B 26/06 382/248 |

(Continued)

OTHER PUBLICATIONS

Krichevskiy, Rafail E., "Laplace's Law of Succession and Universal Encoding", IEEE Transactions on Information Theory, vol. 44, No. 1, Jan. 1998, pp. 296-303.

(Continued)

*Primary Examiner* — Lam T Mai
(74) *Attorney, Agent, or Firm* — Cantor Colburn LLP; William Kinnaman

(57) ABSTRACT

A system and method to manage a non-universal encoder and a universal encoder for compression of data include receiving the data. The data includes symbols. The method also includes subdividing the data into a first set of data blocks and a second set of data blocks and generating a non-universal encoder using the first set of data blocks. The non-universal encoder includes first codes. Each of the first codes corresponds to one of the symbols in the first set of data blocks only and at least one of the first codes includes fewer bits than the symbol corresponding to the at least one of the first codes. The method further includes compressing the second set of data blocks using at least the non-universal encoder.

20 Claims, 6 Drawing Sheets

(56) References Cited

U.S. PATENT DOCUMENTS

2013/0262411 A1* 10/2013 Kadatch ............... G06F 3/0608
                                                      707/693
2017/0068460 A1*  3/2017 Shin .................... G06F 3/0608
2017/0352696 A1* 12/2017 Panicacci .......... H01L 27/14643
2018/0137294 A1*  5/2018 Van Antwerpen ...... G06F 21/79

OTHER PUBLICATIONS

Kung et al., "Partitioned Compressive Sensing with Neighbor-Weighted Decoding", The 2011 Military Communications Conference—Track 1—Waveforms and Signal Processing, pp. 149-156.

Neuhoff et al., "Fixed Rate Universal Block Source Coding with a Fidelity Criterion", IEEE Transactions on Information Theory, Sep. 1975, pp. 511-523.

Soh et al., "Proposal and Evaluation of Hybrid Encoding of CSP to SAT Integrating Order and Log Encodings", WSPC/Instruction File, Dec. 19, 2016, pp. 1-28.

* cited by examiner

US 10,585,626 B2

MANAGEMENT OF NON-UNIVERSAL AND UNIVERSAL ENCODERS

BACKGROUND

The present invention relates to data compression, and more specifically, to the management of non-universal and universal encoders.

Data compression refers to the process of encoding information using fewer bits than the original representation. Each component or symbol of the original data is encoded to a compressed representation based on the code used by the encoder, and this compressed representation can be decoded back to the symbol based on the same code. A universal encoder is one that stores a code for every possible symbol. For example, when 8-bit data (i.e., data whose symbols can have values that range from 0 to 255) is encoded, a corresponding universal encoder includes 256 codes associated with the 256 possible values of the data. A non-universal encoder, on the other hand, includes codes associated with only a subset of all possible symbols. Thus, while a non-universal encoder has a potential disadvantage that it cannot compress a given symbol, it also has the advantage of increasing the compression rate by being able to use fewer bits than the universal encoder. To reap the advantages of the non-universal encoder while being able to compress all the desired data, management of non-universal and universal encoders is desirable in the art.

SUMMARY

Embodiments of the present invention are directed to systems and methods to manage a non-universal encoder and a universal encoder for compression of data. The method includes receiving the data. The data includes symbols. The method also includes subdividing the data into a first set of data blocks and a second set of data blocks, and generating a non-universal encoder using the first set of data blocks. The non-universal encoder includes first codes. Each of the first codes corresponds to one of the symbols in the first set of data blocks only, and at least one of the first codes includes fewer bits than the symbol corresponding to the at least one of the first codes. The method further includes compressing the second set of data blocks using at least the non-universal encoder.

DETAILED DESCRIPTION

As previously noted, non-universal encoders can increase compression rate over universal encoders by including codes for only a subset of the full set of possible symbols. However, when a symbol that is not part of the subset is encountered, the processor must revert to using a universal encoder in order to perform the compression. Embodiments of the systems and methods detailed herein relate to management of non-universal and universal encoders. Specifically, the data to be compressed is divided into blocks, and a non-universal encoder is developed based on symbols in one or more blocks. In subsequent blocks, if one or a threshold number of symbols is found not to have a corresponding code in the non-universal encoder, then a universal encoder is used. According to different embodiments of the invention, the universal encoder can be developed concurrently with the non-universal encoder or upon encountering the symbol or symbols that have no corresponding code in the non-universal encoder.

Figure 1:
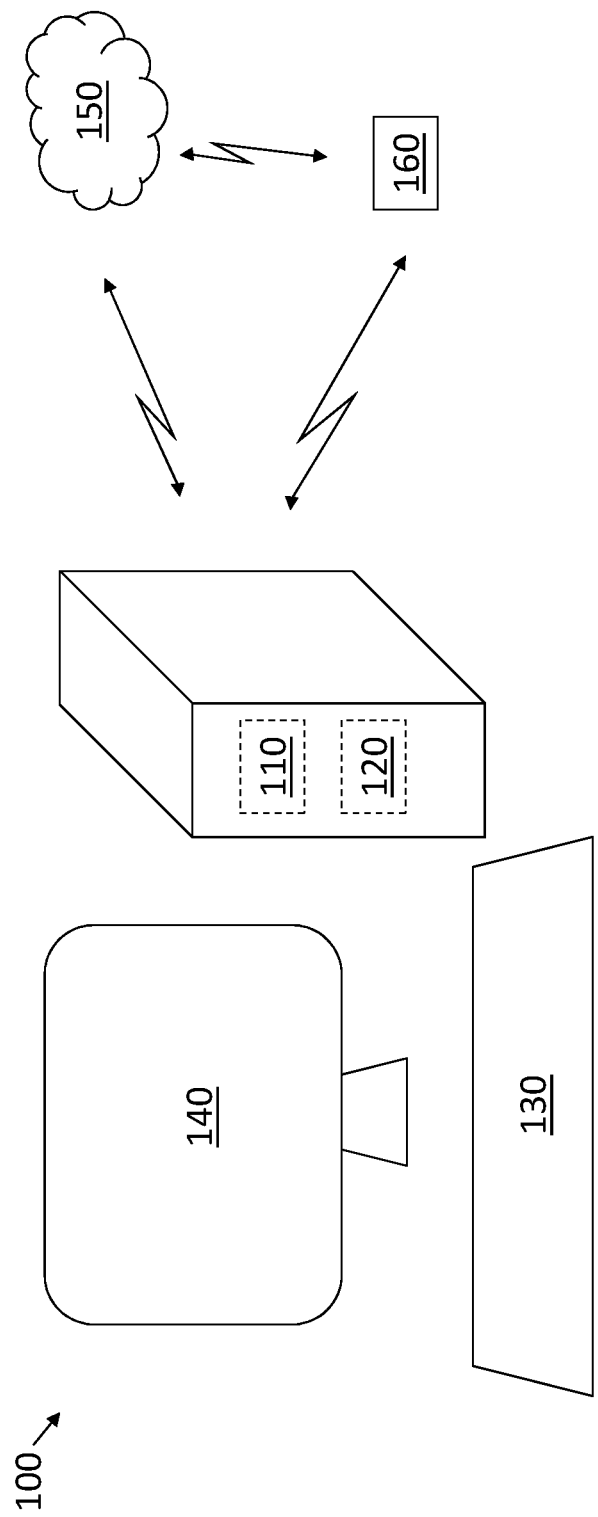
FIG. 1 is a block diagram of a system to perform compression based on management of non-universal and universal encoders according to one or more embodiments of the invention.

FIG. 1 is a block diagram of a system 100 to perform compression based on management of a non-universal encoder 210 (FIG. 2) and a universal encoder 220 (FIG. 2) according to one or more embodiments of the invention. The system 100 includes processing circuitry implemented as one or more processors 110 and one or more memory devices 120, as shown, or as an application specific integrated circuit (ASIC), electronic circuit, or the like. The exemplary system 100 shown in FIG. 1 includes input interfaces like the keyboard 130 and output interfaces such as a display monitor 140. The system 100 can communicate with other devices 160. The other devices 160 can be other systems 100, cellular systems, or the like. The communication can be wireless or through physical coupling and can also be direct or via a cloud-based server 150. Based on the communication, the data for compression can be provided by one of the other devices 160 and the compressed data can be provided to one of the other devices 150.

Figure 2:
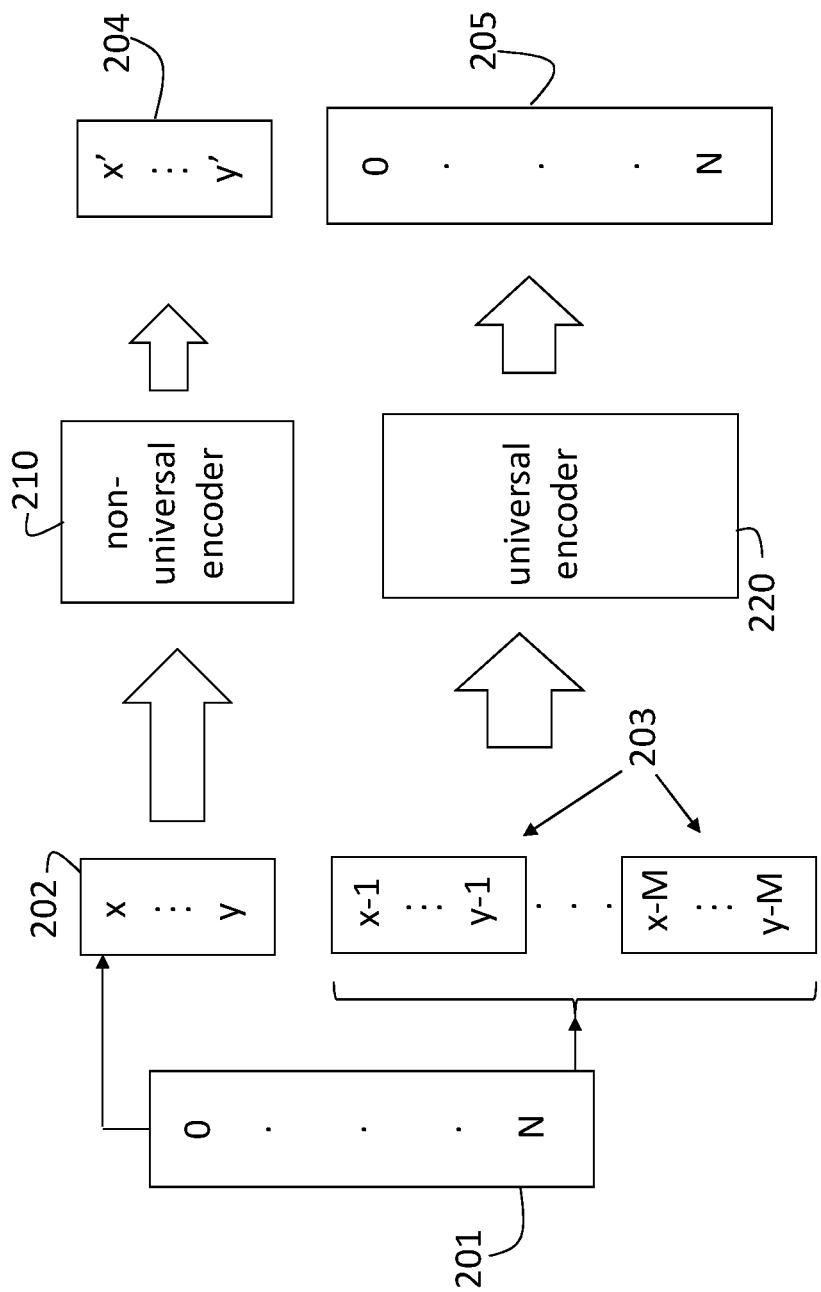
FIG. 2 illustrates the compression by a non-universal encoder and a universal encoder according to embodiments of the invention.

FIG. 2 illustrates the compression by a non-universal encoder 210 and a universal encoder 220 according to embodiments of the invention. A complete set of symbols 0 to N is shown as an input 201. A second input 202 is generated as a subset of the complete set of symbols shown as input 201. This second input 202 can be thought of as a data block that is a subset of the input 201. As FIG. 2 indicates, a non-universal encoder 210 can generate output 204, which includes codes for only the second input 202. The output 204 uses fewer bits than the input 202. As FIG. 2 also indicates, a universal encoder 220 can generate output 205, which includes codes for all the complete set of symbols indicated as input 201. The complete set of symbols of the input 201 can be divided into blocks 203, with each block 203 being the same size as the second input 202, for example. The output 205 can be generated for a block 203 of symbols at a time. The output 205 uses fewer bits than the input 201, but the output 204 can use even fewer bits than the output 205.

Figure 3:
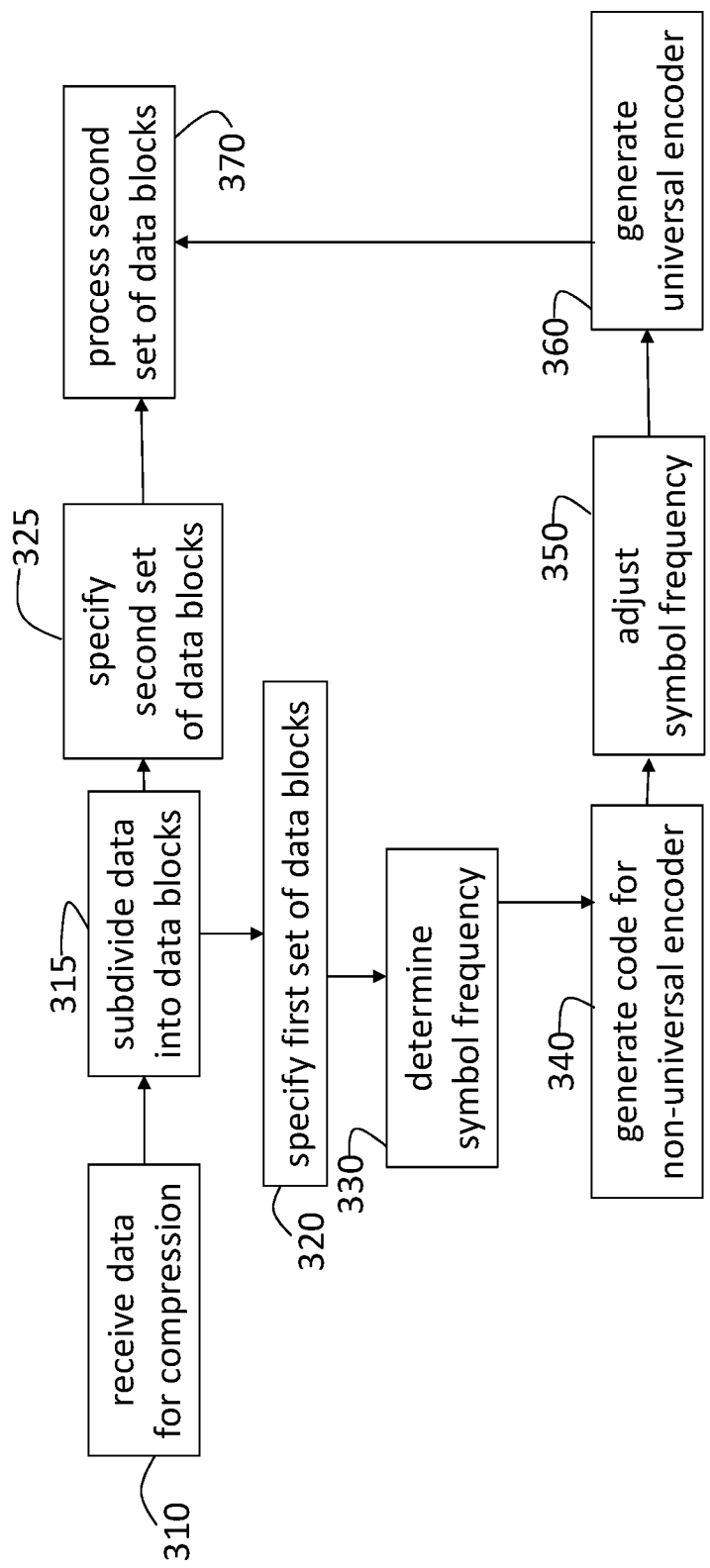
FIG. 3 details the processes performed on a first subset of data for compression according to an embodiment of the invention.
Figure 4:
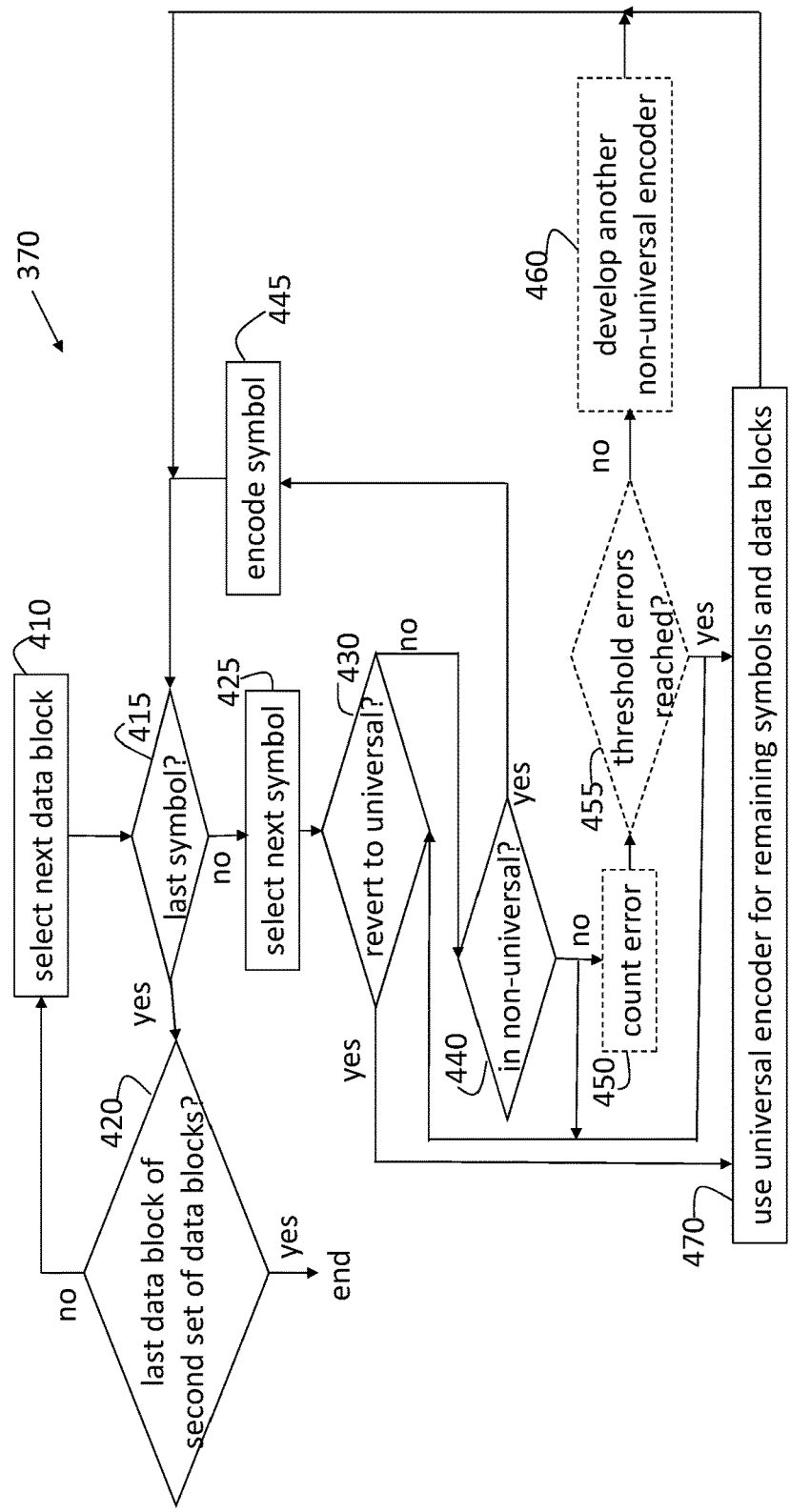
FIG. 4 details the processes that are part of processing the second set of blocks, as shown in FIG. 3.

FIGS. 3 and 4 show process flows of methods of managing a non-universal encoder 210 and a universal encoder 220 according to one or more embodiments of the invention. FIG. 3 details the processes performed on a first subset of data blocks for compression according to an embodiment of the invention. At block 310, receiving data for compression is followed by subdividing the data into data blocks, at block 315. For example, 1 megabyte (MB) of data can be received at block 310 and subdivided into data blocks of 32 kilobytes (KB) each at block 315. Each of the data blocks need not be the same size (i.e., need not include the same number of symbols) according to other exemplary embodiments. The data comprises symbols of a given size (e.g., 1 byte (8 bits))

and the processes described result in compression of each of the symbols to a code that requires fewer bits that the original symbol.

The symbol size indicates the full set of possible symbols in the data. For example, when the symbols are 8 bits each, the possible values of the data (i.e., possible symbols) are 0 to 255. According to some known standard data formats (e.g., DEFLATE (RFC1951)), the total number of possible symbols is larger than just the possible byte values of 0 to 255. Before the data is encoded, it goes through a process of finding backwards references (e.g., using the known LZ77 algorithm) which generates additional symbols to the standard set of byte values. In the exemplary case of the DEFLATE data format, additional symbols bring the total potential symbols up to 285. This set of symbols requires more than eight bits for encoding to cover all possible values. Whether a known standard data format is used or not, because all possible symbols for the data are known, a universal encoder 220 can be generated even when all the possible symbols are not part of the data received at block 310.

At block 320, specifying a first set of data blocks refers to specifying the number of data blocks that will be used to generate the non-universal encoder 210 (at block 340). The first set of data blocks can be one data block, for example, but can be more than one data block in alternate embodiments. At block 325, specifying a second set of data blocks refers to specifying the remainder of the data blocks that make up the data or the data blocks of the data that are not part of the first set of data blocks. The processing of the first set of data blocks is discussed with reference to FIG. 3, and the processing of the second set of data blocks is discussed with reference to FIG. 4. According to the present embodiment, the universal encoder 220, as well as the non-universal encoder 210, is generated based on the first set of data blocks.

At block 330, determining symbol frequency refers to determining which of the set of possible symbols are part of the first set of data blocks and also determining the frequency of each of the symbols that are part of the first set of data blocks. This can be done iteratively by examining one symbol at a time for each data block within the first set of data blocks and increasing a count associated with each symbol that is encountered, for example. At block 340, generating code for the non-universal encoder 210 is based on which symbols have a non-zero frequency associated with them. A Dynamic Huffman Tree (DHT) can be used, for example. The DHT is a known adaptive coding technique that involves using fewer bits for more frequently encountered symbols. Thus, the symbol frequency determined at block 330 is used to generate a more efficient non-universal encoder 210 that uses even fewer bits for frequently encountered symbols in the first set of data blocks than less frequently encountered symbols.

At block 350, adjusting symbol frequency refers to changing the frequency of every symbol that had a frequency of zero (i.e., every symbol that did not appear among the first set of data blocks) to a frequency of one. This can be done by modifying the count determined at block 330 or by generating a second count. As discussed with reference to block 460 (FIG. 4), generating a second count rather than modifying the original count can facilitate the generation of a new non-universal encoder 210 according to an exemplary embodiment.

At block 360, generating the universal encoder 220 refers to using the modified count or the second count. That is, codes are generated based on the frequency of appearance of every symbol being at least one. After both the non-universal encoder 210 and the universal encoder 220 are generated based on the first set of data blocks, processing of the second set of data blocks is performed at block 370, as detailed with reference to FIG. 4.

FIG. 4 details the processes that are part of processing the second set of data blocks, at block 370 shown in FIG. 3. As noted above, according to the present embodiment, both the non-universal encoder 210 and the universal encoder 220 have been generated (at blocks 340 and 360, respectively) prior to the processing of the second set of data blocks according to the processes shown in FIG. 4. At block 410, selecting the next data block refers to iteratively selecting each data block among the second set of data blocks. At block 415, a check is done on whether the last symbol of the selected data block has been selected already. If it has, then a check is done, at block 420, of whether the last data block in the second set of data blocks has been selected. If not, the iterations continue by selecting the next data block, at block 410. If the last data block of the second set of data blocks has been selected, then the processes end, as shown.

If the last symbol of the selected data block has not yet been selected, according to the check at block 415, then selecting the next symbol is performed at block 425. A check is performed on whether to revert to the universal encoder 220, at block 430. The conditions under which this check would be true are discussed with reference to blocks 440 and 455. When this condition is not true (i.e., when the processing of symbols should not revert to the universal encoder 220), then a check is done, at block 440, of whether the selected symbol has a corresponding code in the non-universal encoder 210. If it does, then encoding the symbol according to the non-universal encoder 210 is performed, at block 445. If the symbol does not have a corresponding code in the non-universal encoder 210 (i.e., the symbol was not among the symbols in the first set of data blocks that were used to generate the non-universal encoder 210, at block 340), then a count of the error may optionally be updated, at block 450. The optional processes at blocks 450, 455, and 460 are discussed below. Alternately, the symbol not having a corresponding code in the non-universal encoder 210, according to the check at block 440, may result in an input to block 430 to indicate that subsequent symbols should be provided directly to block 470.

At block 450, counting errors refers to keeping a count of the number of symbols from the second set of data blocks that have no corresponding code in the non-universal encoder 210 (i.e., that were not in the first set of data blocks that were used to generate the non-universal encoder 210 at block 340). A check is done at block 455 of whether the number of symbols without a corresponding code in the non-universal encoder 210 exceeds a predefined threshold. If it does, then the encoding of the symbol can be performed by the universal encoder 220 (at block 470) and, additionally, input can be provided to the processing at block 430 to revert the encoding of subsequent symbols to the universal encoder (at block 470).

If the number of errors (counted at block 450) has not exceeded the threshold (at block 455), then the optional processes include developing another non-universal encoder 210, at block 460. Specifically, the new non-universal encoder 210 includes not only the symbols in the first set of data block 300 is maintained at block 350 but also the selected symbol, at block 425. When the symbol frequency count that was determined at block 330 is maintained at block 350 (i.e., a second count is generated for purposes of generating the universal encoder 220 and the initial count is maintained) then the generation of a new non-universal encoder 210 is made more efficient, because, otherwise, the frequency of each symbol among the first set of data blocks must be determined again as part of the processing at block 460.

All of the symbols in the second set of data blocks are processed according to the processes shown in FIG. 4. When the optional processes at blocks 450, 455 and 460 are not performed, then the path from the check at block 440 to the input to the reversion at block 430 is followed. That is, the first time a symbol from the second set of data blocks does not find a corresponding code in the non-universal encoder 210, the non-universal encoder 210 is abandoned and using the universal encoder 220 for the remaining symbols of the remaining data blocks is performed, at block 470.

Figure 5:
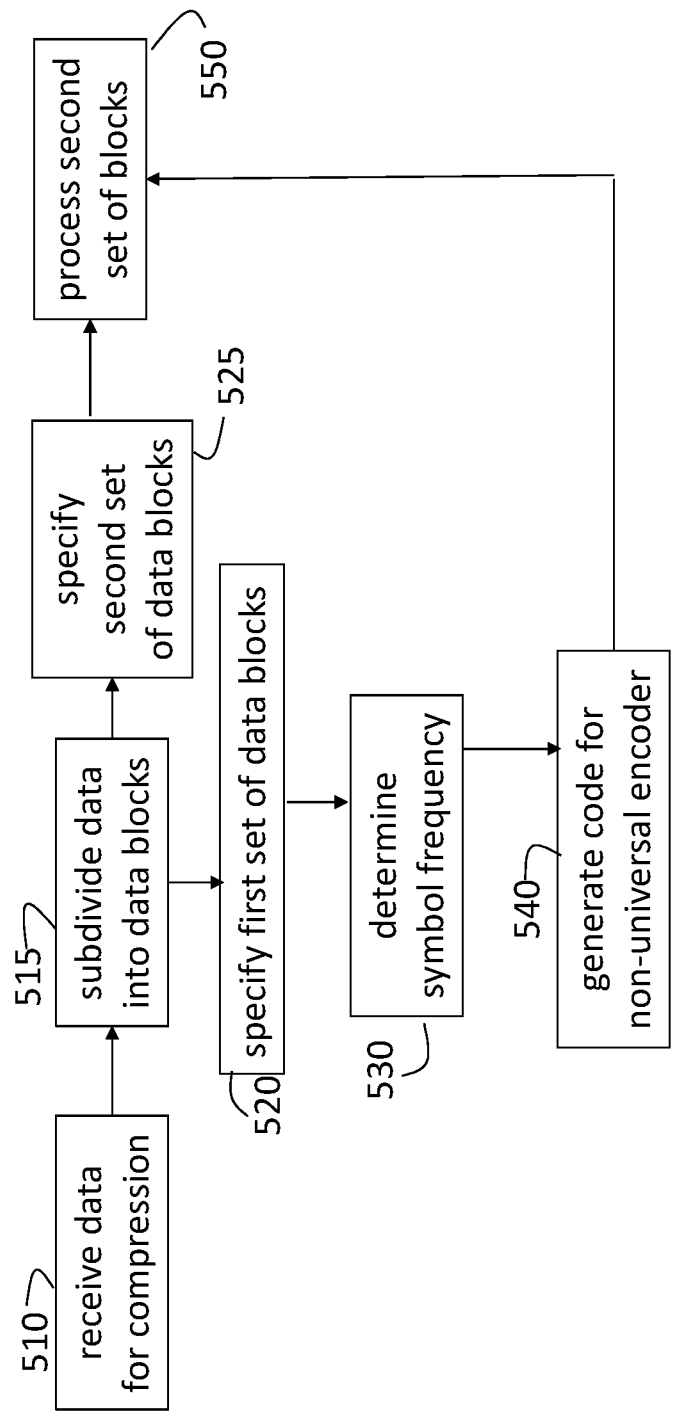
FIG. 5 details the processes performed on a first subset of data for compression according to an alternate embodiment of the invention.
Figure 6:
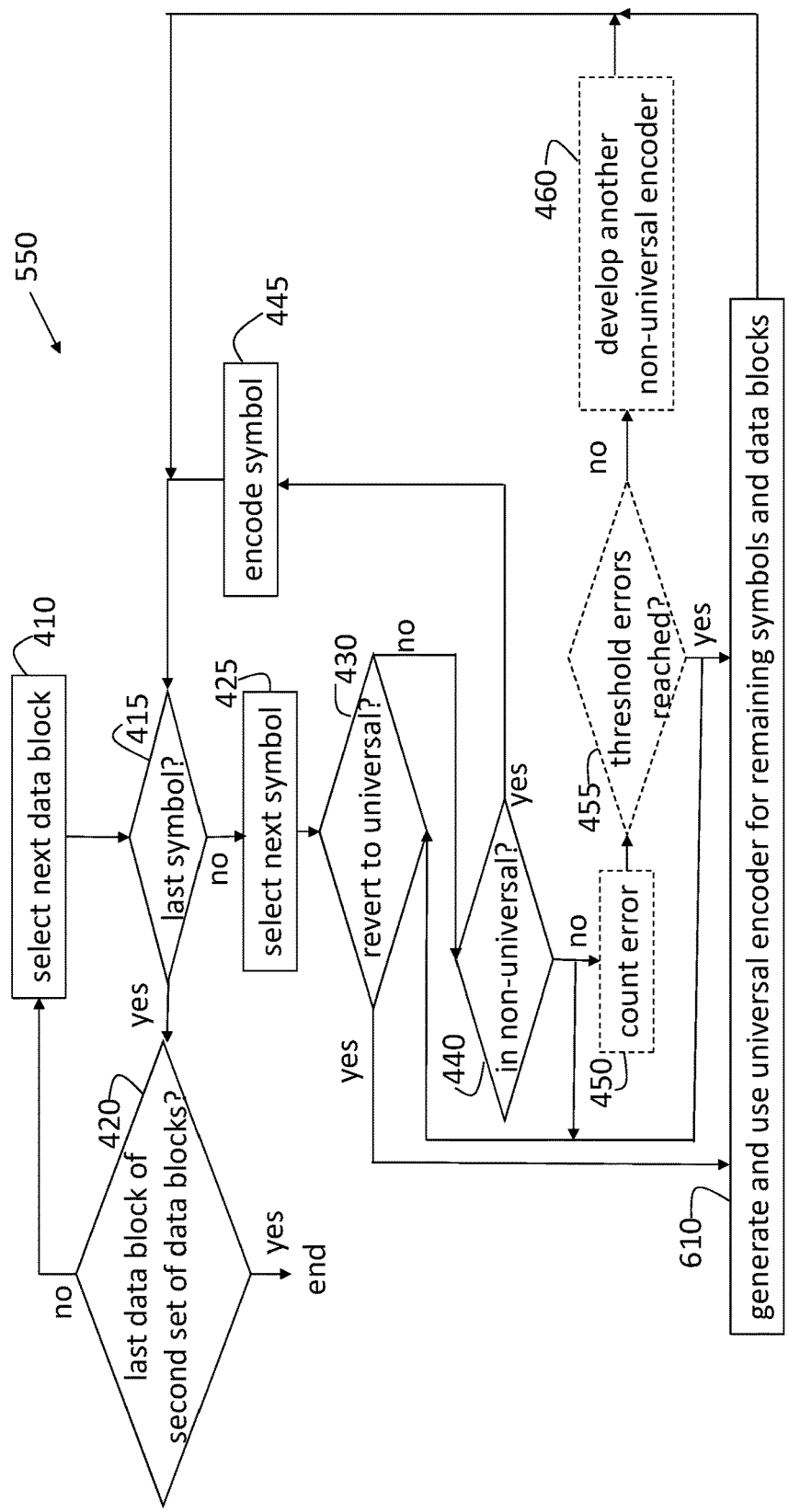
FIG. 6 details the processes that are part of processing the second set of blocks, as shown in FIG. 5.

FIGS. 5 and 6 show process flows of methods of managing a non-universal encoder 210 and a universal encoder 220 according to alternate one or more embodiments of the invention. Unlike the embodiment discussed with reference to FIGS. 3 and 4, the universal encoder 220 is not generated concurrently with the generation of the non-universal encoder 210 using the first set of blocks. Thus, FIG. 5 is a simplified version of FIG. 3 that does not include the processes involved in generating the universal encoder 220.

FIG. 5 details the processes performed on a first subset of data blocks for compression according to an alternate embodiment of the invention. All of the processes in FIG. 5 find analogs in FIG. 3, but the processes in FIG. 3 related to generating the universal encoder 220 are not in FIG. 5. At block 510, receiving data for compression is followed by subdividing the data into data blocks, at block 515. The subdividing results in specifying a first set of data blocks, at block 520, and specifying a second set of data blocks, at block 525. These processes are similar to those discussed with reference to blocks 310, 315, 320, and 325.

As in the embodiment discussed with reference to FIG. 3, the first set of data blocks is used to generate the non-universal encoder 210. Specifically, determining symbol frequency is performed at block 530. This determination is used to generate the non-universal encoder 210, at block 540. The processes at blocks 530 and 540 are the same as those at blocks 330 and 340. After the non-universal encoder 210 is generated, at block 540, the processing the second set of data blocks, at block 550, is performed, as described with reference to FIG. 6.

FIG. 6 details the processes that are part of processing the second set of data blocks, at block 550 of FIG. 5. Unlike the embodiment discussed with reference to FIGS. 3 and 4, the present embodiment does not include generation of the universal encoder 220 concurrent with the generation of the non-universal encoder 210. Thus, while most of the processes shown in FIG. 6 are identical to those discussed with reference to FIG. 4 (as indicated by the reference numbers), the process at block 610 is different than the process at block 470 of FIG. 4.

Specifically, whether it is reached from block 430, block 440, or block 455, block 610 includes generating the universal encoder 220 the first time it is reached. Subsequent executions of the processes at block 610 include only using the universal encoder 220 on the currently selected symbol. As previously noted, the universal encoder 220 is not generated along with the non-universal encoder 210 during processing of the first set of data blocks, as in the previous embodiment. Thus, the first use of the universal encoder 220, according to the present embodiment, requires generating the universal encoder 220.

According to the embodiments detailed herein, the technical field of data compression is improved by the management of a non-universal encoder and a universal encoder. For a given set of symbols, the non-universal encoder includes corresponding codes that requires even fewer bits than codes generated by a universal encoder. Thus, using a non-universal encoder for even a subset of the data improves the overall compression ratio.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of managing a non-universal encoder and a universal encoder for compression of data, the method comprising:
   receiving, using an input interface, the data, the data comprising symbols;
   subdividing, using a processor, the data into a first set of data blocks and a second set of data blocks;
   generating, using the processor, a non-universal encoder using the first set of data blocks, the non-universal encoder comprising first codes, wherein each of the first codes corresponds to one of the symbols in the first set of data blocks only and at least one of the first codes includes fewer bits than the symbol corresponding to the at least one of the first codes; and
   compressing, using the processor, the second set of data blocks using at least the non-universal encoder.

2. The computer-implemented method according to claim 1, further comprising generating a universal encoder, the universal encoder comprising a second code corresponding to each of the symbols in the data.

3. The computer-implemented method according to claim 2, wherein the generating the universal encoder is done concurrently with the generating the non-universal encoder.

4. The computer-implemented method according to claim 2, wherein the generating the universal encoder is done during the compressing the second set of data blocks.

5. The computer-implemented method according to claim 1, wherein the compressing the second set of data blocks additionally uses the universal encoder.

6. The computer-implemented method according to claim 5, wherein the compressing the second set of data blocks includes using the non-universal encoder until a first time one of the symbols in the second set of data blocks does not correspond to one of the first code.

7. The computer-implemented method according to claim 5, wherein the compressing the second set of data blocks includes using the non-universal encoder until a threshold number of times that one of the symbols in the second set of data blocks does not correspond to one of the first code.

8. A system to manage a non-universal encoder and a universal encoder for compression of data, the system comprising:
   an input interface configured to receive data, the data comprising symbols; and
   a processor configured to subdivide the data into a first set of data blocks and a second set of data blocks, to generate a non-universal encoder using the first set of data blocks, the non-universal encoder comprising first codes, wherein each of the first codes corresponds to one of the symbols in the first set of data blocks only and at least one of the first codes includes fewer bits than the symbol corresponding to the at least one of the first codes, and to compress the second set of data blocks using at least the non-universal encoder.

9. The system according to claim 8, wherein the processor is further configured to generate a universal encoder, the universal encoder comprising a second code corresponding to each of the symbols in the data.

10. The system according to claim 9, wherein the processor generates the universal encoder concurrently with generating the non-universal encoder.

11. The system according to claim 9, wherein the processor generates the universal encoder during compression of the second set of data blocks.

12. The system according to claim 8, wherein the processor additionally uses the universal encoder to compress the second set of data blocks.

13. The system according to claim 12, wherein the processor uses the non-universal encoder until a first time one of the symbols in the second set of data blocks does not correspond to one of the first code.

14. The system according to claim 12, wherein the processor uses the non-universal encoder until a threshold number of times that one of the symbols in the second set of data blocks does not correspond to one of the first code.

15. A computer program product for managing a non-universal encoder and a universal encoder for compression of data, the computer program product comprising a non-transitory computer readable storage medium having program instructions embodied therewith, the program instructions executable by a processor to perform a method comprising:

receiving the data, the data comprising symbols;

subdividing the data into a first set of data blocks and a second set of data blocks;

generating a non-universal encoder using the first set of data blocks, the non-universal encoder comprising first codes, wherein each of the first codes corresponds to one of the symbols in the first set of data blocks only and at least one of the first codes includes fewer bits than the symbol corresponding to the at least one of the first codes; and compressing the second set of data blocks using at least the non-universal encoder.

16. The computer program product according to claim 15, further comprising generating a universal encoder, the universal encoder comprising a second code corresponding to each of the symbols in the data.

17. The computer program product according to claim 16, wherein the generating the universal encoder is done concurrently with the generating the non-universal encoder or during the compressing the second set of data blocks.

18. The computer program product according to claim 15, wherein the compressing the second set of data blocks additionally uses the universal encoder.

19. The computer program product according to claim 18, wherein the compressing the second set of data blocks includes using the non-universal encoder until a first time one of the symbols in the second set of data blocks does not correspond to one of the first code.

20. The computer program product according to claim 18, wherein the compressing the second set of data blocks includes using the non-universal encoder until a threshold number of times that one of the symbols in the second set of data blocks does not correspond to one of the first code.

* * * * *